United States Patent
Kubo et al.

(10) Patent No.: US 6,199,273 B1
(45) Date of Patent: *Mar. 13, 2001

(54) METHOD OF FORMING CONNECTOR STRUCTURE FOR A BALL-GRID ARRAY

(75) Inventors: Toshihiko Kubo, Sanda; Takuji Ito, Mine; Hiroshi Takamichi, Ube; Akihiro Hidaka, Yamaguchi-ken, all of (JP)

(73) Assignees: Sumitomo Metal Industries, Ltd., Osaka; Sumitomo Metal (SMI) Electronics Devices Inc., Mine, both of (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/769,449

(22) Filed: Dec. 19, 1996

(30) Foreign Application Priority Data

Dec. 19, 1995 (JP) .................................................... 7-330469
Mar. 21, 1996 (JP) .................................................... 8-064977

(51) Int. Cl.⁷ .................................................... H01R 9/00
(52) U.S. Cl. ........................... 29/843; 29/842; 174/250; 174/259; 174/260; 174/262
(58) Field of Search ........................... 174/250, 260, 174/262, 263, 266, 259; 29/893, 825, 842

(56) References Cited

U.S. PATENT DOCUMENTS

| | | | |
|---|---|---|---|
| 4,412,642 | * 11/1983 | Fisher, Jr. | 29/843 |
| 5,060,844 | 10/1991 | Behun et al. | 228/180.2 |
| 5,147,084 | * 9/1992 | Behun et al. | 228/56.3 |
| 5,275,330 | * 1/1994 | Isaacs et al. | 228/180.2 |
| 5,293,072 | * 3/1994 | Tsuji et al. | |
| 5,402,776 | * 4/1995 | Tsuji et al. | 29/843 |
| 5,450,290 | * 9/1995 | Boyko et al. | 361/792 |
| 5,459,287 | * 10/1995 | Swamy | 174/266 |
| 5,479,703 | * 1/1996 | Desai et al. | 29/852 |
| 5,504,227 | * 4/1996 | Danner | 174/261 |
| 5,571,593 | * 11/1996 | Arldt et al. | 428/131 |
| 5,615,477 | * 4/1997 | Sweitzer | 29/840 |
| 5,637,920 | * 6/1997 | Loo | 257/700 |
| 5,699,612 | * 12/1997 | Inoue et al. | 29/843 |
| 5,764,485 | * 6/1998 | Lebaschi | 361/774 |
| 5,787,580 | * 8/1998 | Woo | 29/843 |
| 5,796,559 | * 8/1998 | Barrow | 361/774 |

FOREIGN PATENT DOCUMENTS

| | | |
|---|---|---|
| 1-145891 | 6/1989 | (JP) . |
| 5-144995 | 6/1993 | (JP) . |
| 7-014942 | 1/1995 | (JP) . |
| 8-236911 | 9/1996 | (JP) . |

OTHER PUBLICATIONS

Coombs, Jr., Clyde, Printed Circuits Handbook, 4th edition, McGraw–Hill, pp. 19.44–19.45, 1995.*

* cited by examiner

*Primary Examiner*—Carl J. Arbes
(74) *Attorney, Agent, or Firm*—Burns, Doane, Swecker & Mathis, LLP

(57) ABSTRACT

A ball-grid array connector structure for an electronic package in which the ball pitch can be reduced to increase the packaging density has a plastic substrate having at least one hollow through-hole and an electrode covering the wall of the through-hole and forming an electrode pad surrounding the through-hole on each surface of the substrate. A metallic ball is joined, either directly or through a solder or a combination of a metallic bump and a solder, to the electrode pad on at least one surface of the substrate at the position of the through-hole. The connector structure can be formed either by sealing an open end of the through-hole on the side to which the ball is not joined, or increasing the pressure within the through-hole by a pressure-control mechanism, before the through-hole is blocked by reflowing the ball itself or the metallic bump or solder used to connect the ball.

14 Claims, 11 Drawing Sheets

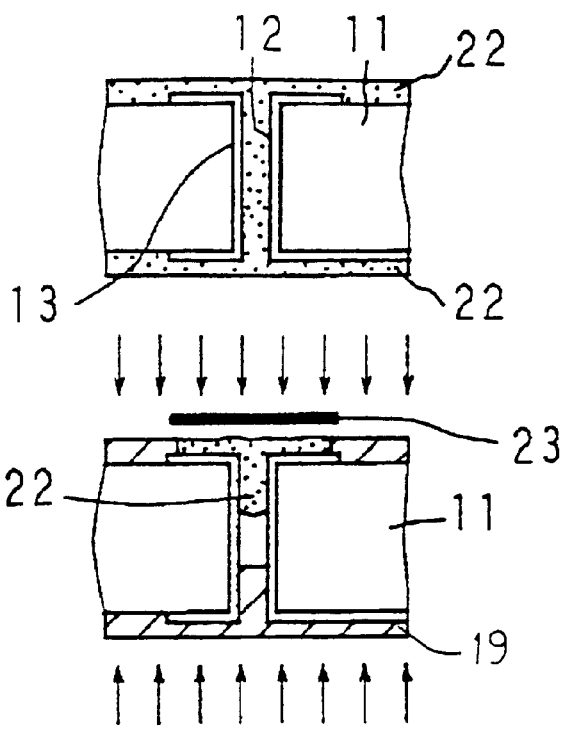
Fig. 9a
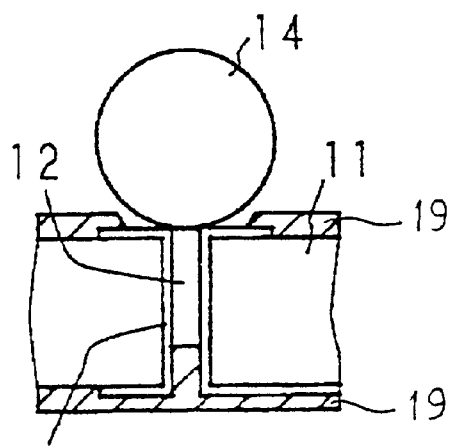
Fig. 9b
Fig. 9c
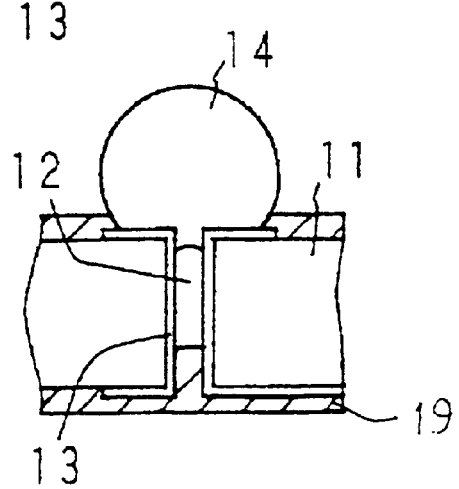
Fig. 9d

METHOD OF FORMING CONNECTOR STRUCTURE FOR A BALL-GRID ARRAY

BACKGROUND OF THE INVENTION

The present invention relates to a connector structure for mounting an electronic package such as a semiconductor or IC package on a printed-circuit board and a method and process for forming such a connector structure. More particularly, it pertains to a connector structure for an electronic package of the ball-grid array (BGA) type to be mounted on a printed-circuit board and a method and process for forming the connector structure.

Electronic packages which are primarily used at present include quad flat packages and pin-grid array packages.

As shown in FIG. 10, a quad flat package (QFP) has a package body 31 containing an electronic device such as an IC chip 32 and a lead frame having leads 33 which project away from all four sides of the package. The package is mounted on a printed-circuit board 34, and the electrical connection between the IC chip 32 and the board 34 (package-to-board interconnection) is attained through the leads 33 which each have one end electrically connected to the chip 32 and another end electrically connected to a conductor pattern formed on the board 34.

In a pin-grid array (PGA) package, as shown in FIG. 11 a package body 31 containing an IC chip 32 has pins 35 which are electrically connected to the IC chip 32 and protrude at right angle from the lower surface of the package body 31. IC chip 32 is electrically connected to a printed-circuit board 34 by inserting the pins 35 into through-holes formed in the board 34 followed by soldering.

However, the designs of these packages are not advantageous for coping with an increase in the number of I/O terminals resulting from an increase in the level of circuit integration of LSIs in recent years, as described below.

In a QFP, since the leads 33 serving as connecting terminals extend away from all four sides of the package body 31, the dimension available for terminals is limited to the total length of the four sides, i.e., 4L (L=length of each side of the package). Therefore, the number of I/O terminals which the package can have is limited.

Compared to a QFP, a PGA package is better able to cope with an increase in the number of I/O terminals, since the pins 35 serving as connecting terminals extend away from the flat lower surface of the package body 31 rather than from the four sides thereof. However, the diameter of the pins 35 cannot be reduced too much since sufficient mechanical strength is required for these pins to be inserted into a printed-circuit board 34. Furthermore, a certain area around each pin 35 should be kept in order to support the pin at the base of the package body. Therefore, there is a limitation on reduction of the pin pitch (center-to-center distance between adjacent pins), and the packaging density on a printed-circuit board attainable by a PGA package is still insufficient to cope with recent increases in the number of I/O terminals.

In view of these situations, BGA packages as shown in FIGS. 12a and 12b have been attracting attention in recent years. In the BGA package shown in these figures, a package body 31 has electrode pads 36A which are electrically connected to an IC chip 32. The package is positioned on a printed-circuit board 34 having electrode pads 36B such that the electrode pads of the package are in registration with those of the board, and each pair of electrode pads 36A and 36B facing each other is connected through a metallic ball 37, in place of a pin 35 used in the PGA package shown in FIG. 11. The metallic balls 37 are usually solder balls so as to make it possible to attain package-to-board interconnection by melting (reflowing) at a relatively low temperature.

Due to the use of metallic balls 37, a BGA package can have a pad pitch (center-to-center distance between adjacent electrode pads) smaller than the pin pitch of a PGA package, which requires that a relatively large area be kept around each pin for support. Therefore, for a BGA package, it is possible to increase the number of connecting terminals over that attainable by a PGA package, leading to an increase in packaging density on a printed-circuit board. At present, the smallest I/O pitch (pin pitch) for a PGA packages is 1.27 mm, while it is possible for a BGA package to reduce the I/O pitch (pad pitch) to 0.6 mm.

In a BGA package, a metallic ball is usually pre-set on each electrode pad of an electronic package with the aid of an adhesion force given by a flux, which is typically a mixture of a solvent, rosin, and an activator. The metallic ball is then heated for reflowing (remelting) to join it to the electrode pad, thereby making it possible to create an electrical connection between the electrode pads of the package and the printed-circuit board through the ball, as described in European Patent No. 236,221. U.S. Pat. No. 5,060,844 discloses a connector structure using a solder ball having a high melting point via a solder having a low melting point.

A plastic substrate for an electronic package normally has hollow through-holes which penetrate the substrate from one surface to the other surface. Since it is difficult to form a connecting terminal directly atop such a hollow through-hole, many attempts have been made to form a through-hole connection using a metallic ball.

FIG. 13a shows a convention typical connector structure in cross section using metallic balls on a plastic substrate having hollow through-holes. A plastic substrate 41 has a through-hole 42 and an electrode 43 formed so as to cover the wall of the hollow through-hole 42 in order to electrically connect the two surfaces of the substrate 41. The electrode 43 slightly extends onto the two surfaces of the substrate so as to form an electrode pad which surrounds the open end of the through-hole on each surface of the substrate. The electrode 43 is electrically connected to an IC chip 32 mounted on the upper surface of the substrate 41. As can be seen from the plan (bottom) view of FIG. 13b, the electrode 43 has an extension 43A on the lower surface of the substrate 41 facing away the IC chip 32. A metallic ball in the form of a solder ball 44 is joined to a second electrode pad 45 formed in contact with the extension 43A of the electrode 43 on the lower surface of the substrate. This connector structure is called a dog bone because of its shape in the plan view shown in FIG. 13b.

However, the dog bone-type connector structure has the following problems.

(1) In order to prevent the solder ball 44 from flowing toward the substrate around the electrode 43 including its extension 43A when melting, it is necessary to form a solder resist layer which repels molten solder over the electrode 43. The formation of the solder resist layer requires a complicated process comprising the steps of applying a solder resist solution and forming holes in the resulting solder resist layer by use of photoetching technology, and it is time-consuming.

(2) Since extra space is required to locate the second electrode pad 45 apart from the through-hole 42, such a BGA package provides only a limited increase in packaging density and limited size reduction.

A process has been proposed to form another structure for through-hole connection by filling a through-hole with a resin which may be electrically conductive, curing the filled resin by heating, plating the surface of the cured resin, and joining a metallic ball to the plated coating. This process is also complicated and not suitable for practical application.

SUMMARY OF THE INVENTION

It is an object of the present invention to provide a connector structure for a BGA package which has a high bonding (shear) strength and a good ability to endure thermal cycling, which can increase the packaging density, and which can be formed by a relatively simple process.

Another object of the present invention is to provide a method and process for forming such a connector structure.

In general, the present invention provides a connector structure of the ball-grid array type (hereinafter referred to as a BGA connector structure) in an electronic package having at least one hollow through-hole, comprising at least one metallic ball joined to the package, more precisely to an electrode of the package, at the position of the through-hole on at least one surface of the package.

In one embodiment, the metallic ball is a solder ball which is directly joined to an electrode of the package.

The BGA connector structure of this embodiment can be formed by a method comprising joining the metallic ball to the package at the position of the through-hole by reflowing the metallic ball while the pressure within the through-hole is controlled.

A process for forming the above-described BGA connector structure comprises the steps of sealing an open end of the through-hole on one surface of the package, setting a metallic ball on the other surface of the package at the position of the through-hole, and subjecting the metallic ball to reflowing to join the ball to the package.

Another process for forming the above-described BGA connector structure comprises the steps of increasing the pressure within the through-hole slightly above atmospheric pressure, setting a metallic ball on the package on one surface thereof at the position of the through-hole, and subjecting the metallic ball to reflowing to join the ball to the package while the pressure within the through-hole is kept slightly above atmospheric pressure.

In another embodiment of a BGA connector structure, a metallic ball is joined to an electrode of the package on at least one surface thereof at the position of the through-hole either through a solder, or a combination of a metallic bump and a solder. The melting point of the solder is preferably either lower than that of the metallic ball, or lower than those of both the metallic ball and the metallic bump.

Such a BGA connector structure can be formed by a method comprising either melting the solder to join the ball to the package through the solder or melt-forming the metallic bump on the package, at the position of the through-hole, while the pressure within the through-hole is controlled.

A process for forming such a BGA connector structure comprises the steps of sealing an open end of the through-hole on one surface of the package, melt-forming a metallic bump on the other surface of the package at the position of the through-hole, forming a solder-containing layer on the metallic bump, setting a metallic ball on the solder-containing layer, and subjecting the solder-containing layer to reflowing to join the metallic ball to the metallic bump through the solder.

Another process for forming such a BGA connector structure comprises the steps of increasing the pressure within the through-hole slightly above atmospheric pressure, melt-forming a metallic bump on one surface of the package at the position of the through-hole while the pressure within the through-hole is kept slightly above atmospheric pressure, forming a solder-containing layer on the metallic bump, setting a metallic ball on the solder-containing layer, and subjecting the solder-containing layer to reflowing to join the metallic ball to the metallic bump through the solder.

A further process for forming such a BGA connector structure comprises the steps of sealing an open end of the through-hole on one surface of the package, setting a metallic ball having a surface coating of solder on the other surface of the package at the position of the through-hole, and subjecting the solder coating to reflowing to join the metallic ball to the package through the solder.

A still further process for forming such a BGA connector structure comprises the steps of increasing the pressure within the through-hole slightly above atmospheric pressure, setting a metallic ball having a surface coating of solder on one surface of the package at the position of the through-hole, and subjecting the solder coating to reflowing to join the ball to the package through the solder while the pressure within the through-hole is kept slightly above atmospheric pressure.

Instead of using a metallic ball having a surface coating of solder, a metallic ball joined through a solder by forming a solder-containing layer on one surface of the package at the position of a through-hole, and setting a metallic ball on the solder-containing layer followed by reflowing the layer while the pressure within the through-hole is controlled in the above-described manner.

In still another embodiment of a BGA connector structure the electronic package has a substrate in which the at least one through-hole is formed, and the substrate has an electrically insulating film overlaid on both surfaces thereof except for the area on at least one surface thereof to which the metallic ball is attached.

A process for forming such a BGA connector structure comprises the steps of applying a photoresist film to both surfaces of the substrate, forming an opening in the photoresist film one surface of the substrate at the position of the through-hole by exposure of a selected area of the photoresist film followed by development, setting a metallic ball in the opening of the photoresist film on that one surface of the substrate, and subjecting the ball to reflowing to join it to the substrate.

Another process for forming such a BGA connector structure comprises the steps of applying a photoresist film to both surfaces of the substrate, forming an opening in the photoresist film on one surface of the substrate at the position of the through-hole by exposure of a selected area of the photoresist film followed by development, setting a metallic ball having a surface coating of solder in the opening of the photoresist film on that one surface of the substrate, and subjecting the solder coating to reflowing to join the metallic ball to the substrate through the solder.

The opening in the photoresist film can be formed, for example, by applying a negative-working photoresist film to each surface of the substrate, exposing the photoresist film on each surface of the substrate to radiation except for an area in the vicinity of the trough-hole on at least one surface to cure the photoresist film in the exposed area, and removing the photoresist film in the unexposed area by treatment with a developing solution.

Other objects as well as the nature and advantages of the present invention will be apparent to those skilled in the art from the following description.

BRIEF DESCRIPTION OF THE DRAWINGS

FIGS. 9a to 9d illustrate a still further process for forming a BGA connector structure according to the present invention;

DETAILED DESCRIPTION OF THE PREFERRED EMBODIMENTS

Figure 1A:
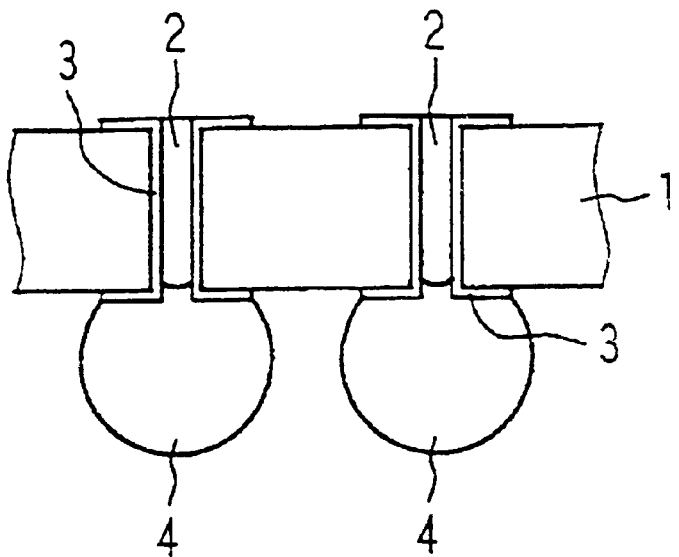
FIGS. 1a and 1b are a cross-sectional view and a plan view, respectively, showing an embodiment of a BGA connector structure according to the present invention.
Figure 1B:
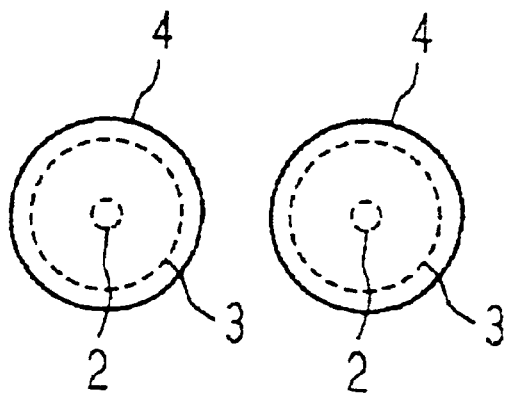

Referring to FIGS. 1a and 1b showing an embodiment of a BGA connector structure according to the present invention, a package body has a plastic substrate 1 having at least one, and normally a number of through-holes 2. The plastic substrate 1 may be formed of a glass-epoxy resin or glass-polyimide resin material including a glass-BT (bismaleimide-triazine, a class of polyimide) resin material. Also a flexible plastic substrate made of a polyimide or a polyester resin, for example, may be used.

An electrode 3 is formed on the wall of each through-hole 2 and extends slightly beyond the through-hole 2 onto the upper and lower surfaces of the substrate 1 so as to form an annular extension of the electrode pad, i.e., electrode pad, surrounding the open end of the through-hole 2 on each surface of the substrate 1. A metallic ball 4 made of a solder, for example, is located on one surface of the substrate 1 at the position of the through-hole 2, i.e., in alignment with the through-hole 2, by joining it to the extension of the electrode 3 (electrode pad) so as to block one of the open ends of the through-hole 2. A part of the metallic ball 4 may slightly enter or penetrate into the through-hole 2, as depicted in FIG. 1a. In that situation, since the contact area between the electrode 3 and the ball 4 is increased, a better electrical connection is obtained.

In the BGA connector structure shown in FIGS. 1a and 1b, the ball 4 is joined directly to the electrode 3 just above the hollow through-hole 2 so that the ball 4 is located on the substrate 1 at the same position as the through-hole 2 or in alignment therewith. Consequently, there is no need to apply a solder resist, and the pitch between adjacent balls 4 can be reduced, thereby making it possible to realize an increased packaging density and size reduction, which are the advantages of BGA packages. Thus, both of the above-described problems (1) and (2) are eliminated by the BGA connector structure of this embodiment.

The BGA connector structure shown in FIGS. 1a and 1b, which has a metallic ball joined directly to a plastic substrate just above a through-hole, can be formed by setting the metallic ball 4 on the extension of the electrode 3 (electrode pad) right above the through-hole 2 on one surface of the plastic substrate 1 in such a manner that the metallic ball 4 blocks the open end of the through-hole 2. The ball 4 on the electrode 3 is then subjected to reflowing, thereby melt-joining the ball 4 to the electrode 3. During the reflowing procedure, the pressure inside the through-hole 2 is controlled in order to prevent an excessive amount of the molten metal material of the ball (e.g., solder) from flowing into the through-hole 2 and avoid the occurrence of connection failures (poor connections). Finally, the substrate 1 is turned upside down, leading to the structure shown in FIG. 1a.

Figures 2A, 2B, 2C:
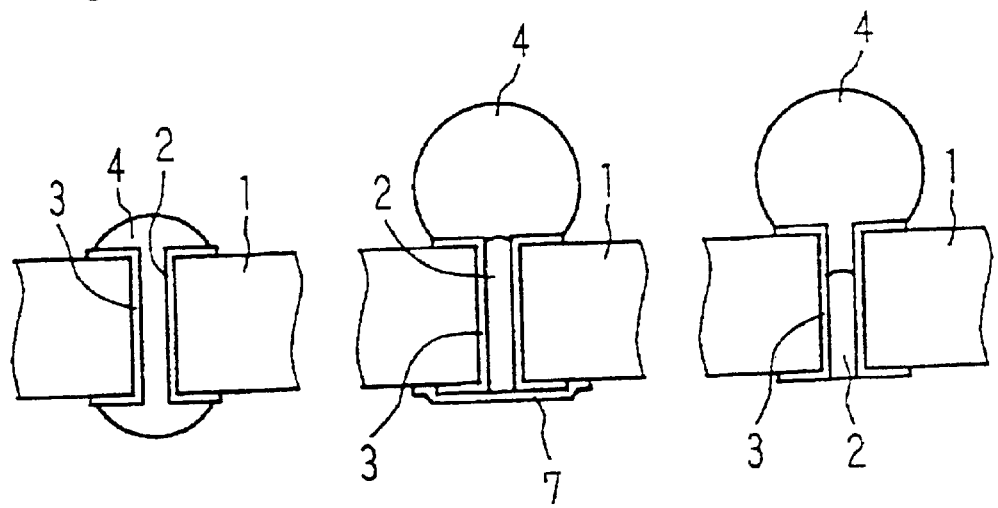
FIGS. 2a, 2b, and 2c schematically illustrate the effect of controlling the pressure within a through-hole in a method for forming a BGA connector structure according to the present invention.

The pressure control inside the through-hole 2 can be performed either by sealing the open end of the through-hole 2 on the other surface of the substrate 1, to which the metallic ball 4 is not to be joined, with tape 7 or a similar member as shown in FIG. 2b, or by connecting that open end to a means capable of pressure control. If the open end of the through-hole 2 on the surface opposite to the surface to which the metallic ball 4 is to be joined is kept open, reflowing of the ball 4 causes the resulting molten material of the metallic ball (e.g., solder ball) to be completely drawn into the through-hole, as shown in FIG. 2a, by the surface tension of the molten material. In contrast, when that open end of the through-hole 2 is sealed with tape 7, the molten material of the metallic ball hardly penetrates into the through-hole 2, as shown in FIG. 2b, due to the air pressure kept within the through-hole 2. When the pressure within the through-hole 2 is maintained by a pressure controlling means at a pressure slightly higher than atmospheric pressure, the amount of the molten material of the metallic ball which penetrates into the through-hole 2 can be controlled, as shown in FIG. 2c.

The BGA connector structure shown in FIGS. 1a and 1b can possess shear (bonding) strength and reliability (durability) when subjected to thermal cycling (i.e., good resistance to thermal cycling) at least at the same level as a conventional connector structure, by controlling the condition under which the metallic ball 4 is joined as described above.

The following embodiment of the present invention can further improve the shear (bonding) strength and reliability of the BGA connector structure.

Figure 3:
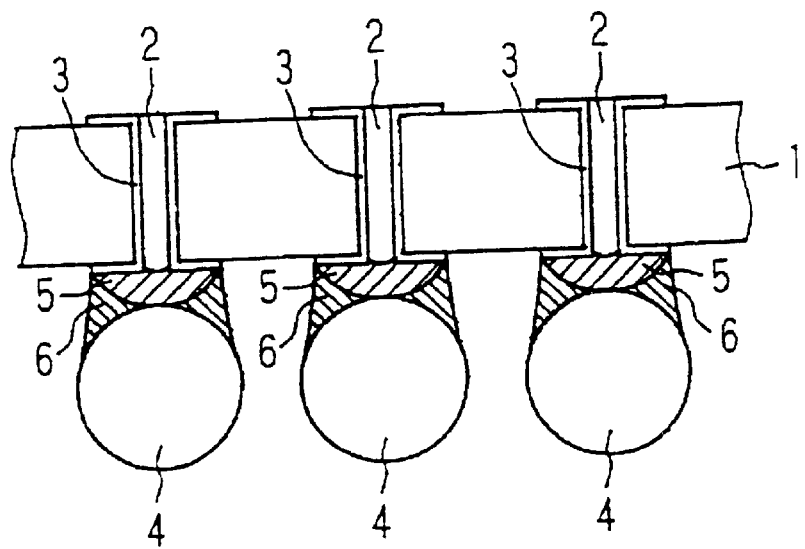
FIG. 3 is a cross-sectional view showing another embodiment of a BGA connector structure according to the present invention.

FIG. 3 shows a cross section of another embodiment of a BGA connector structure according to the present invention. In this figure, the same parts as in FIG. 1 are indicated by the same reference numbers. A package body has a plastic substrate 1 having at least one through-hole 2. An electrode 3 is formed on the wall of each through-hole 2 and extends slightly beyond the through-hole 2 onto the upper and lower surfaces of the substrate 1 so as to form an annular extension of the electrode 3 (electrode pad) surrounding the open end of the through-hole 2 on each surface of the substrate 1, as in the embodiment described previously. A metallic bump 5 is formed on the surface of the substrate 1 at the position of the through-hole 2 by joining the bump 5 to the extension of the electrode 3 (electrode pad) so as to block one of the open ends of the through-hole 2. A metallic ball 4 made of solder, for example, is joined to the metallic bump 5 through a connecting solder 6.

Figure 4:
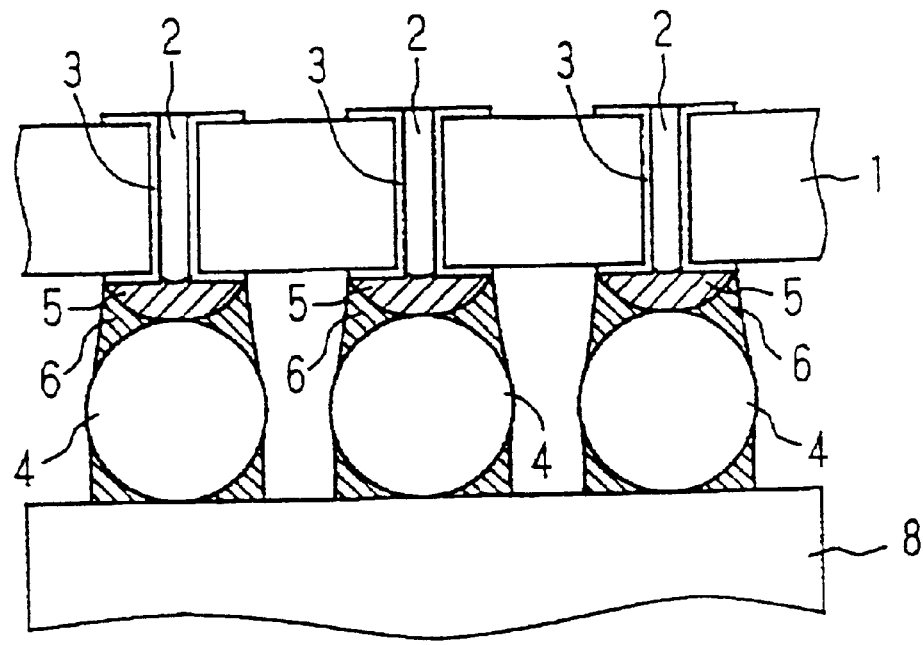
FIG. 4 is a cross-sectional view showing the connection of the BGA connector structure shown in FIG. 3 to a printed-circuit board.

In the BGA connector structure shown in FIG. 3, the metallic ball 4 is located just above the hollow through-hole 4, as in the embodiment shown in FIGS. 1a and 1b. Therefore, both the problems of conventional BGA packages can be eliminated. The embodiment shown in FIG. 3 can provide a prolonged lifetime when it is subjected to thermal cycling, since it has a connector height greater than that of the embodiment shown in FIGS. 1a and 1b due to the addition of the metallic bump 5 and the absence of deformation of the metallic ball 4 during reflowing as shown in FIG. 1a, and the metallic bump 5 and the ball 4 have a synergistic effect on stress absorption. The BGA connector of this embodiment connected to a printed-circuit board 8 is shown in FIG. 4.

The BGA connector structure shown in FIG. 3, which has an integrated connector structure including a metallic bump, a solder, and a metallic ball at a position just above a through-hole, can be formed in the following manner. First, after the open end of the through-hole 2 on the side remote from the side on which the metallic ball 4 is to be joined is sealed by a suitable means such as tape, a solder paste or a conductor paste is applied to the substrate on the other side of the through-hole 2 so as to block the open end of the through-hole and cover the electrode pad 3 on that side, and the paste is subjected to reflowing to form the metallic bump 5 on the electron pad 3 on one surface. Subsequently, a solder paste for connecting a metallic ball is applied to the metallic bump 5 to form a solder-containing layer, and the metallic ball 4 is set on the solder paste. Thereafter, the solder paste for connecting is subjected to reflowing to join the metallic ball 4 to the metallic bump 5 through the connecting solder 6. Finally, the substrate 1 is turned upside down, leading to the structure shown in FIG. 3. In the above-described method, the pressure control means mentioned previously may be employed, instead of tape, in order to prevent the molten solder or conductor metal forming the bump from entering the through-hole 2 excessively.

In the above-described method, the plastic substrate 1 should withstand the heat applied during reflowing to form the metallic bump 5. It is preferred that neither the metallic ball 4 nor the metallic bump 5 melt while the solder paste for connecting is being reflowed to connect the ball 4 to the bump 5 through the solder 6. Since cracking occurs in the connecting solder 6, the other metal parts, i.e., metallic bump 5 and metallic ball 4, in which cracking does not occur, are preferably formed of a relatively soft metallic material such that they have a high effect of absorbing stresses and strains. On the other hand, the connecting solder 6 in which cracking occurs is preferably formed of a relatively hard metallic material such that propagation of cracks can be prevented. Taking these points into consideration, the mechanical properties and melting points (M.P.) desired for the metallic bump 5, connecting solder 6, and metallic ball 4 are as follows.

| Metal Parts | Desirable Properties | M.P. |
|---|---|---|
| Metallic bump 5 | Soft to such a degree that the part can absorb thermal stresses | $t_1$ |
| Connecting solder 6 | Relatively hard and having a high fatigue strength | $t_2$ |
| Metallic ball 4 | Soft to such a degree that the part can absorb thermal stresses | $t_3$ |
| Relations between melting points: $t_1, t_3 > t_2$ | | |

The BGA connector structure shown in FIG. 3 which has the mechanical properties and melting points of the metallic parts indicated in the above table has a high resistance to thermal fatigue. The metallic bump 5 is interposed between the electrode 3 and the metallic ball 4, and the metallic ball 4 does not melt when it is joined to the metallic bump 5, thereby completely retaining its ball shape. As a result, the connector structure has an increased height and hence undergoes reduced stresses and strains when subjected to repeated thermal stresses.

Figure 5:
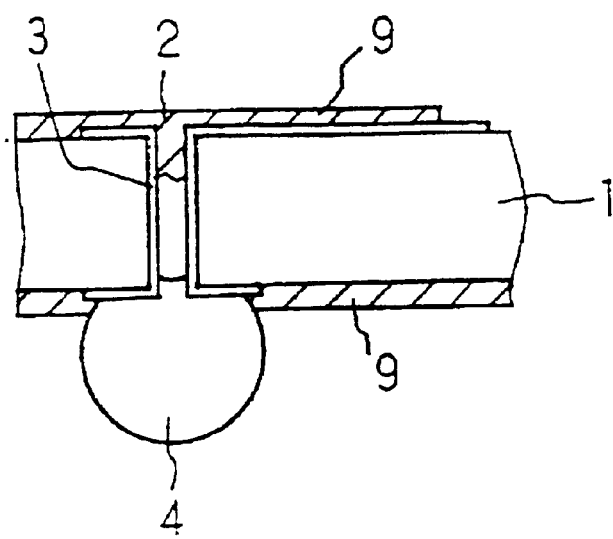
FIG. 5 is a cross-sectional view showing a further embodiment of a BGA connector structure according to the present invention.

FIG. 5 shows a cross section of still another embodiment of a BGA connector structure according to the present invention. Also in this figure, the same parts as in FIG. 1 or 3 are indicated by the same reference numbers. A package body has a plastic substrate 1 having at least one through-hole 2. An electrode 3 is formed on the wall of each through-hole 2 and extends beyond the through-hole 2 onto the upper and lower surfaces of the substrate 1 so as to form an annular extension of the electrode 3 (electrode pad) surrounding the open end of the through-hole 2 on each surface of the substrate 1. A metallic ball 4 made of a solder, for example, is located on one surface of the substrate 1 at the position of the through-hole 2 by joining the ball 4 to the extension of the electrode 3 (electrode pad) so as to block one of the open ends of the through-hole 2. An electrically insulating photoresist layer 9 is formed on the entire surface of the plastic substrate 1 on the side opposite (facing away) the metallic ball 4 and on the entire surface of the other side except for the area to which the metallic ball is attached.

In the BGA connector structure shown in FIG. 5, the ball 4 is located just above the hollow through-hole 2, as in the embodiment shown in FIG. 1. Therefore, both the problems of conventional BGA packages can be eliminated. Due to the formation of the photoresist layer 9 on both surfaces of the plastic substrate 1 except for the area to which the metallic ball 4 is attached, the embodiment shown in FIG. 5 has the advantage that the photoresist layer 9 serves as an insulating and protective layer.

The BGA connector structure shown in FIG. 5, which has a photoresist layer formed on both surfaces of a plastic substrate having a through-hole and an electrode and a metallic ball joined just above the through-hole, can be formed in the following manner. First, a negative-working photoresist solution is applied to both surfaces of the plastic substrate 1, and then dried to form a photoresist film on each surface. Subsequently, the photoresist film on a first side, which is opposite the ball 4, is cured by blanket exposure to radiation (UV light, electron beams, etc.) to form the cured photoresist layer 9 on the entire surface on that side, while the photoresist film on an opposite second side, to which the ball 4 is to be joined, is cured by exposure to radiation except for the area to which the ball 4 is to be attached, i.e., in the vicinity of the through-hole 2, to form the cured photoresist layer 9.

The uncured photoresist film in the vicinity of the through-hole 2, on which the ball 4 is located later, is removed by treatment with a developing solution, thereby forming an opening in the photoresist film 9 on the second side of the substrate 1 at a position just above the through-hole 2. The opening has a diameter sufficient to expose the through-hole and at least part of the surrounding electrode pad therein. The metallic ball 4 is set in the opening of the photoresist film on the second side, and then subjected to reflowing to melt-join the ball 4 to the electrode 3. Finally, the substrate 1 is turned upside down, leading to the structure shown in FIG. 5.

In the above-described method, the photoresist layer 9 formed on the side opposite the ball 4 serves as a sealing member in the same manner as the tape 7 shown in FIG. 2b. Since one of the open ends of the through-hole 2 is sealed by the photoresist layer 9 in this manner, the molten material of the metallic ball 4 hardly penetrates into the through-hole 2 during reflowing due to the air pressure kept within the through-hole.

In this embodiment of the BGA connector structure, the metal ball 4 may be joined to the electrode pad 3 of the substrate 1 through a solder or through a combination of a metallic bump and a solder as described above, instead of direct joining as depicted in FIG. 5.

The processes for forming the above-described embodiments of a BGA connector structure according to the present invention will be described below more specifically.

FIGS. 6a to 6e illustrate a first process for forming a BGA connector structure according to the present invention. The substrate being used is a plastic substrate 11 having at least one and normally a large number of through-holes 12 and an electrode 13 formed on the wall of each through-hole 12. The electrode 13 extends slightly beyond the through-hole 12 on the upper and lower surfaces of the substrate 11 so as to form a circular extension of the electrode (electrode pad) surrounding the open end of the through-hole 12 on each surface of the substrate 11. The electrode 13 is preferably formed by copper plating and typically has a thickness of about 30 μm, but other methods including eyeletting may be employed. When the electrode is made of copper, it may be protected against oxidation by plating it with a non-oxidizable metallic material such as Au or Ni/Au.

Figure 6A:
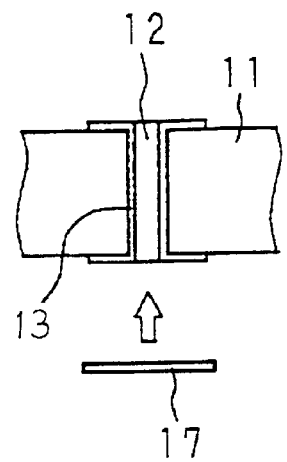
FIGS. 6a to 6e illustrate a process for forming a BGA connector structure according to the present invention.
Figure 6B:
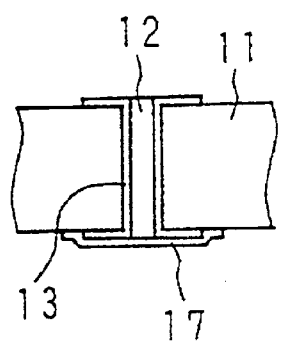
Figure 6C:
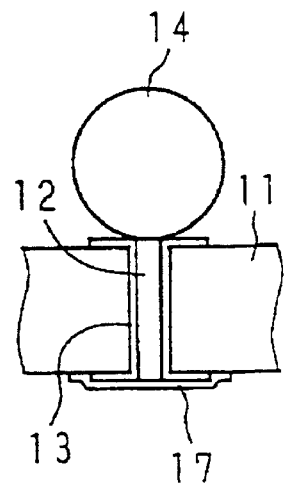
Figure 6D:
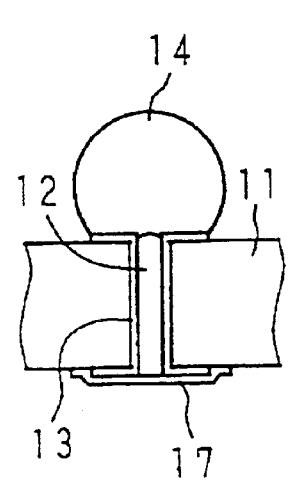
Figure 6E:
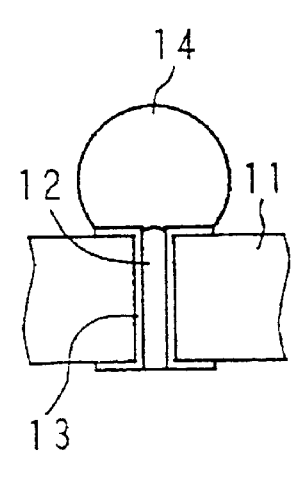

The open end of the through-hole 12 on a first side of the substrate 11 to which the metallic ball 14 is not to be joined is sealed with heat-resisting adhesive tape 17 [FIGS. 6a and 6b]. The tape may be made of a heat-resisting polymer such as a polyimide. A solder ball 14 held by a ball positioning machine (not shown) is positioned so as to sit on the open end of the through-hole 12 on an opposite second side of the substrate 11, to which the ball 14 is to be joined, and it is pre-set in that position [FIG. 6c]. The pre-setting of the solder ball can be performed in a conventional manner, such as by using a flux or a temporary adhesive (which can be removed during reflowing of solder). Preferably, a flux is used for pre-setting. The solder ball 14 is then subjected to reflowing to melt-join the solder ball 14 to the extension of the electrode 13 (electrode pad) around the open end of the through-hole 12 [FIG. 6d]. The pressure within the through-hole 12 is controlled by the adhesive tape 17 which seals the open end of the through-hole on the side facing away the solder ball 14 in order to prevent the molten solder from flowing into the through-hole excessively. Thereafter, the heat-resisting adhesive tape 17 is peeled off, resulting in the formation of the desired BGA connector structure [FIG. 6e].

FIGS. 7a to 7d illustrate a second process for forming a BGA connector structure according to the present invention. A plastic substrate 11 is similar to the one described above for the first process and has at least one and normally a large number of through-holes 12 and electrodes 13.

Figure 7A:
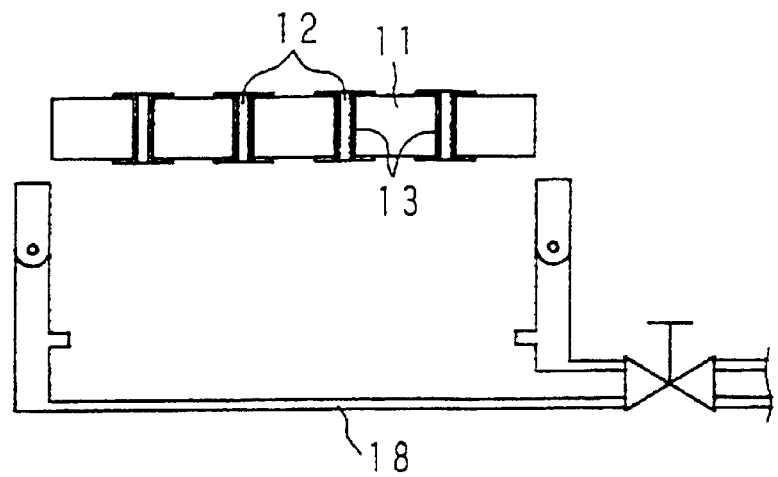
FIGS. 7a to 7d illustrate another process for forming a BGA connector structure according to the present invention.
Figure 7B:
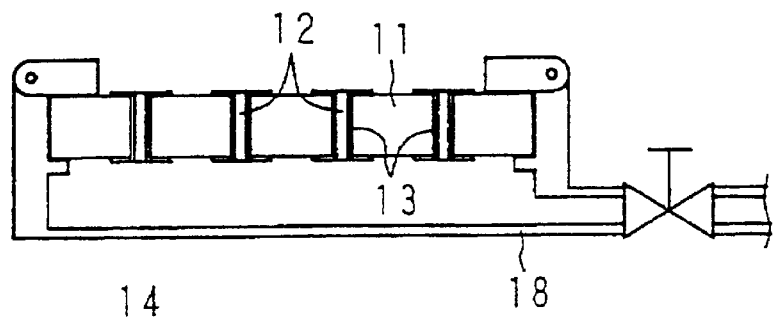
Figure 7C:
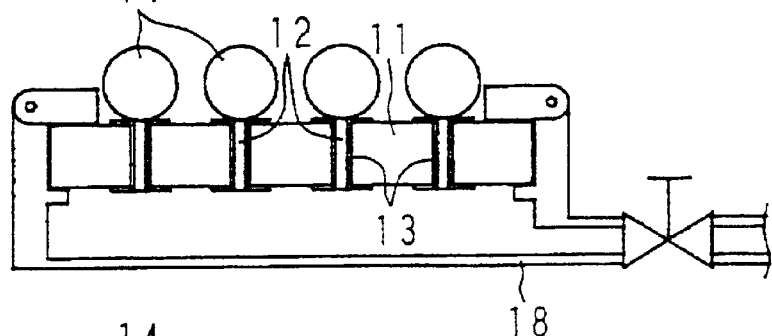
Figure 7D:
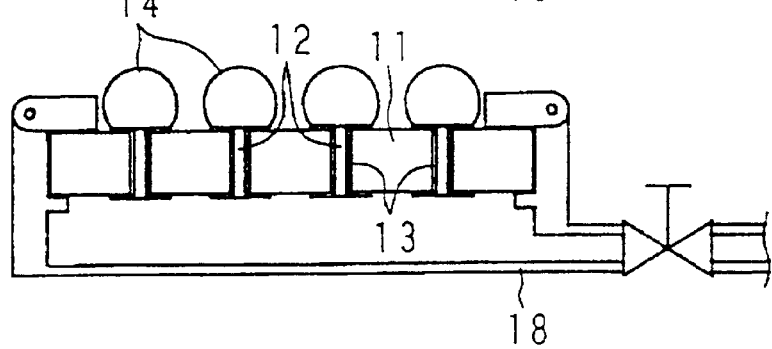

In this process, the plastic substrate 11 is secured to a pressure-control apparatus 18 capable of controlling the pressure within the through-holes 12 [FIGS. 7a and 7b]. Solder balls 14 held by a ball positioning machine (not shown) are positioned so as to sit on the open ends of the through-holes 12 on one side of the substrate 11, and they are pre-set in that position [FIG. 7c]. The solder balls 14 are then subjected to reflowing to melt-join the solder balls 14 to the electrode pads 13 while the pressure within the through-holes 12 is kept slightly higher than atmospheric pressure by the pressure-control apparatus 18 in order to prevent the molten solder of the balls 14 from excessively flowing into the through-holes 12 [FIG. 7d]. The depth of the solder penetrating into the through-hole during reflowing can be controlled by the pressure applied by the apparatus 18, so the applied pressure may vary depending on the desired depth. Finally the plastic substrate 11 is detached from the pressure-control apparatus 18 to form the desired BGA connector structures.

In the first and second processes described above, a flux may be used, as required, when each solder ball 14 is melt-joined to the electrode pad 13 around the through-hole 12 on one surface of the substrate 11. In this case, prior to placement of the solder ball 14 on the substrate 1, a flux is applied to the surface of the solder ball 14 held by the ball positioning machine, and/or to the area of the surface of the electrode 13 to which the solder ball 14 is to be joined. The flux assists in pre-setting of the solder ball, as described above. However, if an excessive amount of the applied flux remains, it may cause evolution of gas or formation of pores in the connector portion during reflowing to join the ball to the substrate or mount the package on a printed-circuit board, thereby leading to a poor connection. Therefore, after the adhesive tape 17 is removed or the substrate 11 is removed from the pressure-control apparatus 18, washing should be performed to remove the flux remaining within the through-hole 12.

The first and second processes may include a first inspection test, after the solder ball 14 is pre-set on the through-hole 12, to detect any ball which does not attach to the substrate 11, and a second inspection test, after the solder ball 14 is melt-joined to the electrode 13 by reflowing, to detect any ball which short-circuits with another ball or which is not attached to the substrate. If any unattached or short-circuited ball is detected in these tests, it may be reprocessed to pass the test, thereby improving the yield in the process.

FIGS. 8a to 8f illustrate a third process for forming a BGA connector structure according to the present invention. A plastic substrate 11 is similar to the one described above for the first process and has at least one and normally a large number of through-holes 12 and electrodes 13.

Figure 8A:
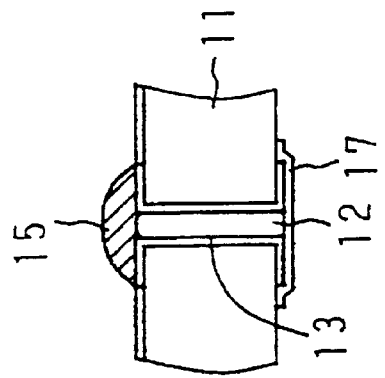
FIGS. 8a to 8f illustrate a further process for forming a BGA connector structure according to the present invention.
Figure 8B:
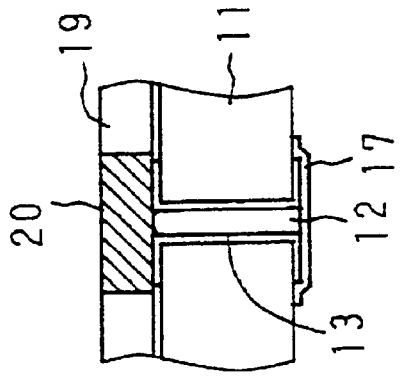

As in the first process, the open end of the through-hole 12 on a first surface of the substrate 11 to which a metallic ball is not joined is sealed with heat-resisting adhesive tape 17 [FIG. 8a]. Subsequently, a metal mask having at least one opening is positioned on an opposite second surface of the plastic substrate 11, to which a metallic ball is to be joined, in such a manner that the opening of the metal mask 19 is positioned in alignment with the through-hole 12 (on and in the vicinity of the through-hole) and the extension of the electrode 13 (electrode pad) appears in the opening of the mask 19 at least partially. A conductor paste 20 which predominantly comprises a powder of a 96.5Sn/3.5Ag alloy (in weight percent), for example, is then applied to the opening of the metal mask 19 by screen printing [FIG. 8b].

Figure 8C:
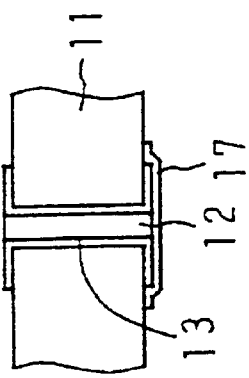
Figure 8D:
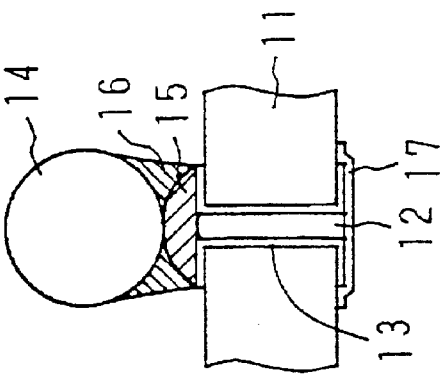

Thereafter, the metal mask 19 is removed and the conductor paste 20 is baked to melt it followed by solidification to form a metallic bump 15 on the electrode pad 13 on the second surface of the substrate 11 to block the open end of the through-hole 12 on that surface [FIG. 8c]. Next, a metal mask 19 having at least one opening is again positioned on the second surface of the substrate 11 in the same manner as described above such that the metallic bump 15 formed appears in the opening. A solder paste 21 for bump-to-ball connection which predominantly comprises a solder powder of a 63Sn/37Pb alloy (in weight percent), for example, is then applied by screen printing to the opening of the metal mask 19 to form a solder-containing layer which covers the metallic bump 15 [FIG. 8d].

Figure 8E:
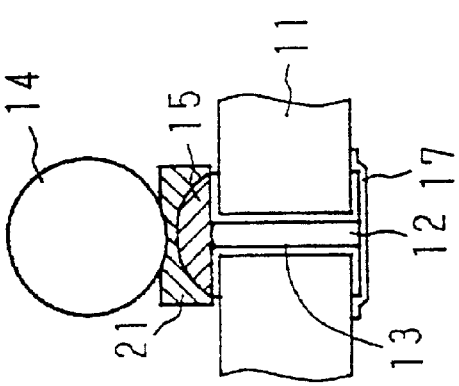
Figure 8F:
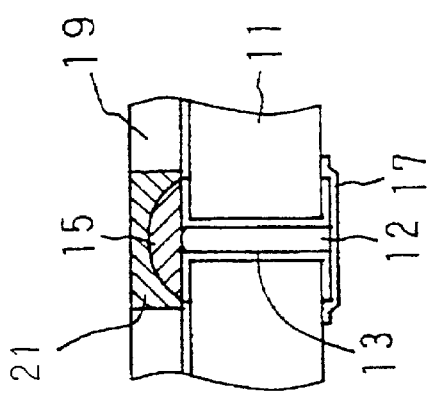
Figure 10:
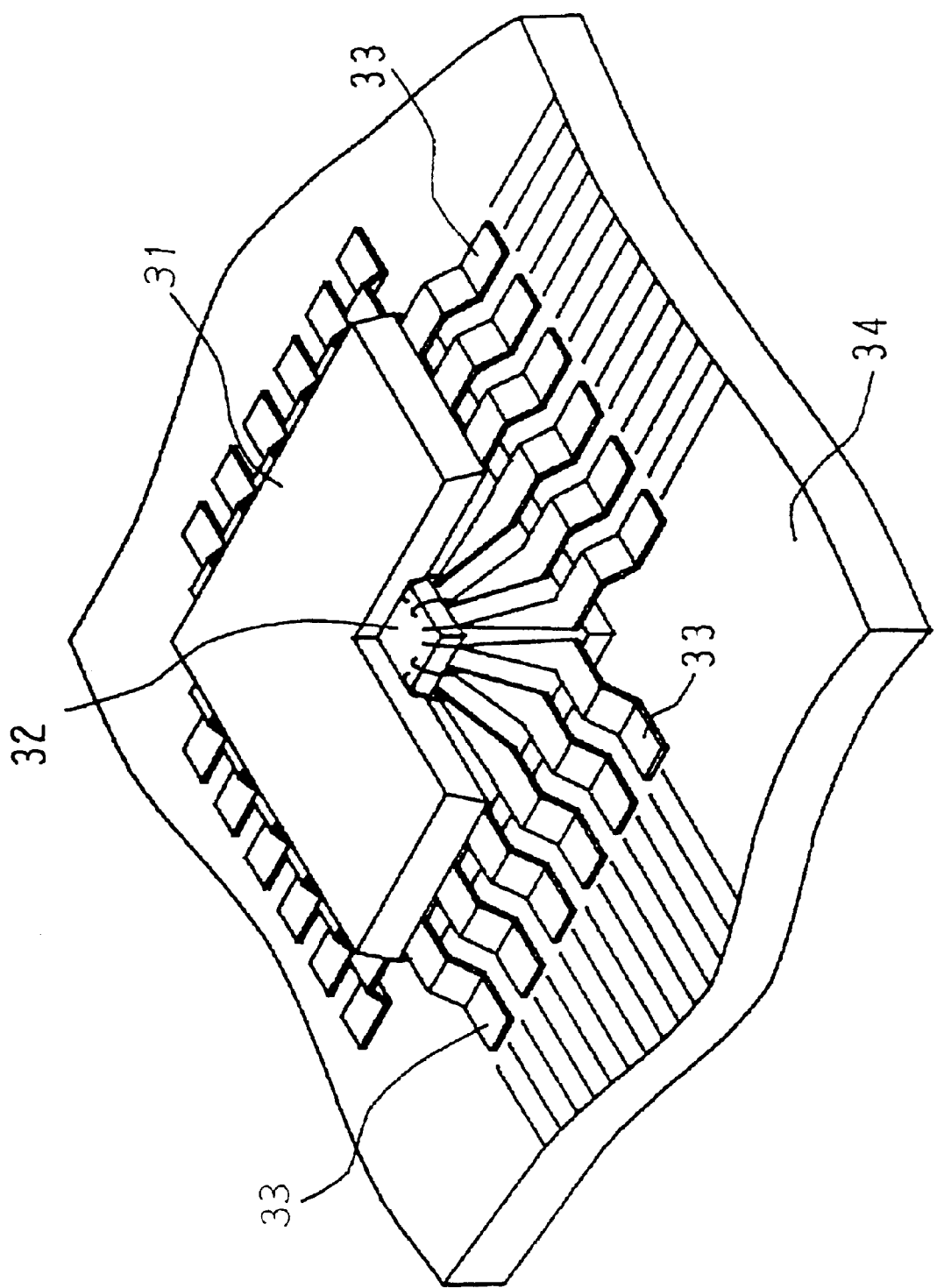
FIG. 10 is a perspective view showing a QFP.
Figure 11:
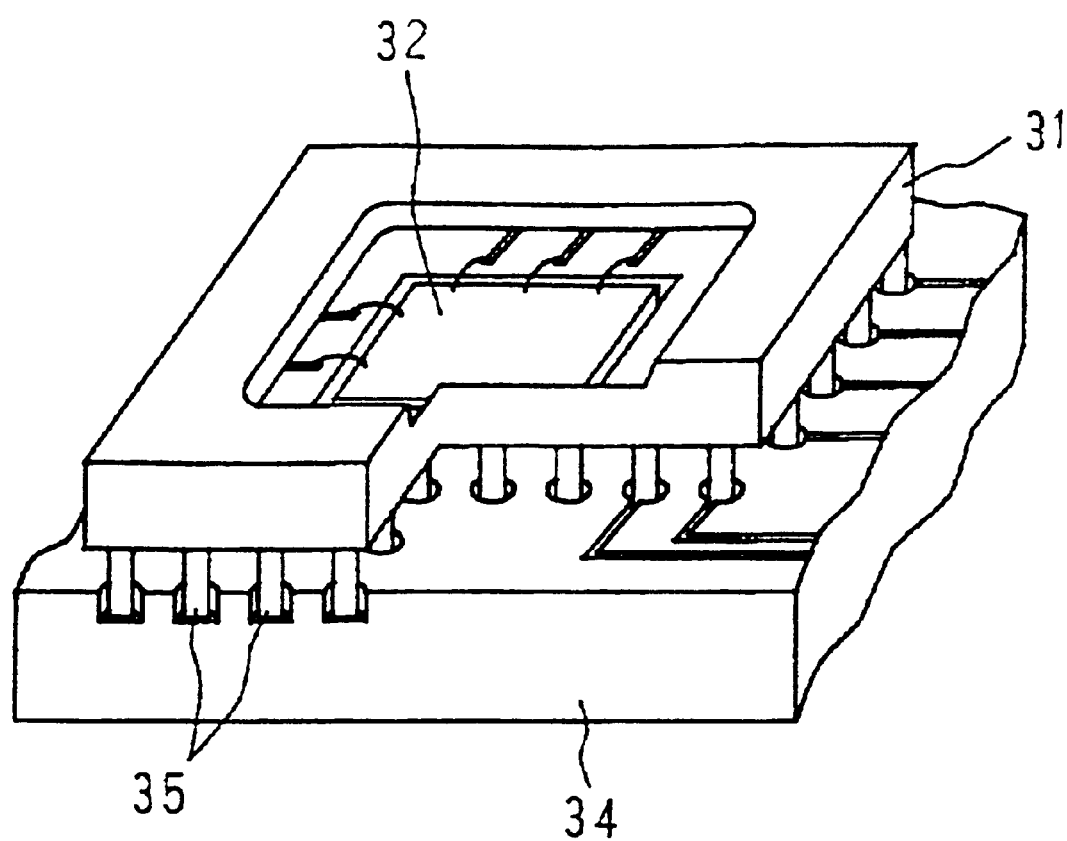
FIG. 11 is a perspective view showing a PGA package.
Figure 12A:
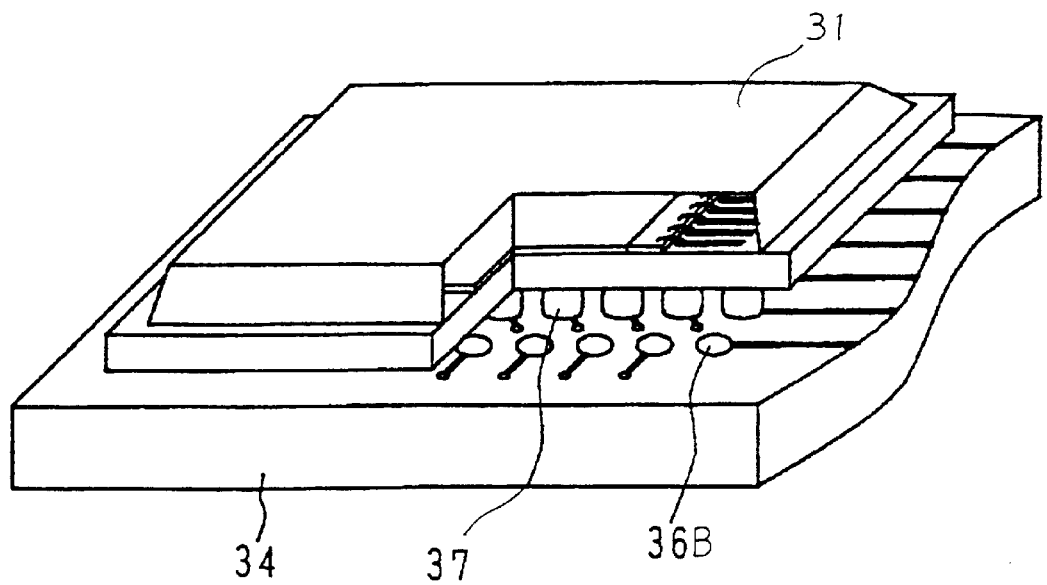
FIGS. 12a and 12b are a perspective view and an enlarged cross-sectional view, respectively, showing a BGA package.
Figure 12B:
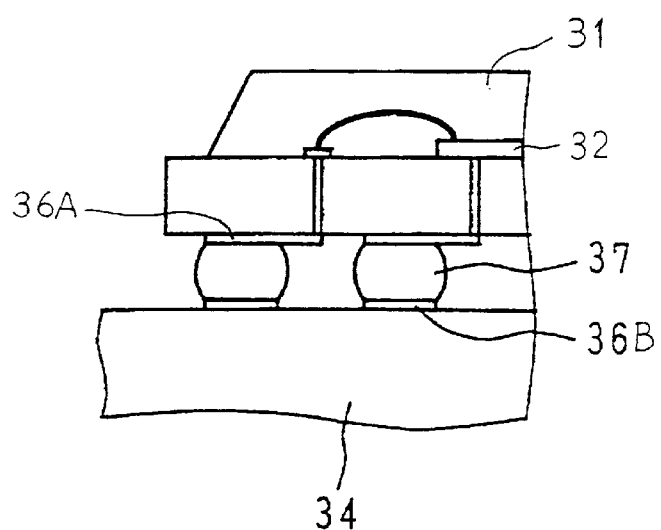

Subsequently, a solder ball 14 made of a 95Pb/5Sn alloy (in weight percent), for example, which is held by a ball positioning machine (not shown) is positioned so as to sit on the applied solder paste 21 (solder-containing layer) and it is pre-set in that position [FIG. 8e]. The solder paste 21 is then subjected to reflowing to join the solder ball 14 to the metallic bump 15 by solder 16 [FIG. 8f]. Thereafter, the heat-resisting adhesive tape 17 is peeled off, resulting in the formation of the desired BGA connector structure including the metallic bump 15, connecting solder 16, and the solder ball 14.

The metallic materials used for the metallic bump 15 and solder ball 14, i.e., 96.5Sn/3.5 Ag and 95Pb/5Sn alloys, respectively, have a low Young's modulus so that they are effective for absorption of stresses and strains as indicated in the above table. The 63Sn/37Pb solder alloy constituting the connecting solder 16 used to join the metallic ball 14 to the metallic bump 15 has a melting point lower than those of both the metallic bump 15 and solder ball 14 in order to prevent the metallic bump 15 and the solder ball 14 from melting during joining these members to each other by the solder 16.

In the above-described third process, one of the open ends of each through-hole 12 is sealed with heat-resisting adhesive tape 17 in order to prevent the conductor paste 20 from flowing excessively into the through-hole 12 during reflowing to form the metallic bump 15. Once the metallic bump 15 is formed, there is no need to control the pressure within the through-hole 12 in the subsequent steps including the step of reflowing the solder paste 21 to connect the solder ball 14 to the bump 15 since the open end of the through-hole 12 is blocked by the bump 15. Therefore, the adhesive tape 17 may be peeled off any time after the formation of the metallic bump 15.

The prevention of excessive flowing of the molten conductor paste 20 into the through-hole 12 during reflowing to form the metallic bump 15 can also be achieved by use of a pressure-control apparatus capable of controlling the pressure within the through-hole, as described above for the second process. It is also possible to replace the conductor paste 20 used to form the metallic bump 15 by a solder paste provided that the solder alloy contained in that solder paste has a melting point higher than that of the solder paste 21 used to form the connecting solder 16.

As in the first and second processes, a flux may be used and/or a first and a second inspection test may be performed in the third process in the same manner as described above.

FIGS. 9a to 9d illustrate a fourth process for forming a BGA connector structure according to the present invention. A plastic substrate 11 is similar to the one described above for the first process and has at least one and normally a large number of through-holes 12 and electrodes 13.

A liquid negative-working solder photoresist composition 22, which can form a photosensitive solder resist film which repels molten solder, is applied to the two surfaces of the substrate 11 by printing [FIG. 9a]. In this step, each through-hole 12 may be completely filled with the solder photoresist composition 22 or a void may remain in the through-hole 12. Subsequently, the applied solder photoresist composition 22 is dried to form a photoresist film on each surface of the substrate. Alternatively, a solder photoresist in the form of a dry film can be used to apply to each surface of the substrate.

In the next exposure step, the entire surface of the dry photoresist film on a first side of the substrate, to which a solder ball is not joined, is exposed to UV light to form a cured photoresist layer 19. On an opposite second side of the substrate, to which a metallic ball is to be joined, a photomask having at least one UV light-shielding area 12 is positioned on the surface of the dry photoresist film such that the light-shielding area of the photomask is in alignment with the through-hole 12, i.e., located just above and in the vicinity of the through-hole (where a metallic ball is to be joined) before the photoresist film is exposed to UV light, thereby causing the dry photoresist film 22 to cure in exposed areas which are not covered by the light-shielding area of the photomask 23 [FIG. 9b]. The curing depth may be controlled by adjusting the exposure conditions (duration, output of the UV lamp used, etc.).

The exposed solder photoresist films on both surfaces of the substrate are then treated with a developing solution to remove the uncured photoresist film existing just above and in the vicinity of the through-hole 12 on one side of the substrate, thereby forming an opening in a cured photoresist layer 19. The opening has a diameter sufficient to expose the through-hole 12 and at least part of the surrounding electrode pad 13 therein. Thereafter, a solder ball 14 which is held by a ball positioning machine (not shown) is positioned in the resulting opening of the photoresist layer 19 so as to sit on the through-hole 12, and it is pre-set in that position [FIG. 9c]. The solder ball 14 is then subjected to reflowing to melt-join the solder ball 14 to the electrode pad 13 surrounding the open end of the through-hole 12 [FIG. 9d].

In the above-described process, a negative-working photoresist is used, and the area of the photoresist film to which the solder all 14 is to be joined is unexposed by using a photomask such that it remains uncured and can be removed by developing. Alternatively, the photoresist may be a positive-working one which is insoluble in a developing solution but becomes soluble in the solution upon exposure. In the latter case, only the area of the positive-working photoresist film to which the solder ball 14 is to be joined is exposed to radiation such as UV light using a suitable photomask and the exposed area of the photoresist film is removed by treatment with a developing solution. Therefore, exposure of the photoresist film on the other side (to which the solder ball is not joined) is omitted.

In the first, second, and fourth processes described above, since a solder ball is used as a metallic ball, the metallic ball can be melt-joined to the electrode by reflowing the metallic ball itself. However, the metallic ball may be formed of an ordinary metallic material, rather than a solder, having a relatively high melting point and being incapable of reflowing. In such cases, a solder-containing layer or a solder pad may be formed on the electrode pad, and the metallic ball is positioned on the solder-containing pad and joined to the electrode pad by reflowing the solder-containing layer while the pressure within the through-hole under solder pad is controlled in the above-described manner.

Alternatively, the metallic ball may have a surface coating of solder formed thereon such that the metallic ball can be joined to the electrode pad by reflowing the solder coating. The surface coating of the metallic ball with a solder may be performed by electrolytic or electroless plating, for example. Also in this case, the pressure within the through-hole on which the metallic ball is positioned is controlled in the above-described manner during reflowing the solder coating of the metallic ball.

The BGA connector structure according to the present invention has been described with respect to the case where a metallic ball is joined to a plastic substrate on one surface thereof facing a printed-circuit board. However, the BGA connector structure can be formed on the other surface of the substrate facing an IC chip when the IC chip is mounted on that surface by a flip chip joining method.

The following examples are presented to further illustrate the present invention. These examples are to be considered in all respects as illustrative and not restrictive.

EXAMPLE 1

A plastic substrate made of a glass-BT (bismaleimide-triazine) resin having 400 through-holes each 0.3 mm in diameter was used to form a ball connector structure. Each through-hole had an Ni—Au plated copper electrode formed so as to cover the wall of the through-hole and extended so as to form an annular (circular) electrode pad 0.72 mm in diameter surrounding the open end of the through-hole on each surface of the substrate.

After the open end of each through-hole on one side of the substrate was sealed with a heat-resisting adhesive tape made of a polyimide resin, a flux was applied to each electrode pad on the other side of the substrate. Thereafter, a solder ball made of a 63Sn/37Pb alloy (in weight percent) and having a diameter of 0.76 mm was positioned on each electrode pad to which the flux had been applied and was heated to a peak temperature of about 210° C. so as to melt the solder ball, resulting in the formation of a 0.65 mm high solder ball joined to the electrode pad.

The cross-section in the vicinity of the resulting ball-to-electrode connector structure was inspected visually. The visual inspection showed that a slight amount of the solder had penetrated into each through-hole and that the amount of the solder entering the through-hole was nearly the same for all the through-holes inspected. The average shear strength of the solder balls joined to the electrodes was 1.75 kgf for 20 balls selected at random.

The above process for forming a ball-to-electrode connector structure was applied to a 21 mm$^2$ BGA package having 256 terminals with a 1.27 mm pitch between adjacent terminals. The resulting BGA package having solder balls joined to the electrodes on the side to be connected to a printed-circuit board was subjected to a thermal cycle test in which each thermal cycle consisted of 20 minutes at 0° C. and 20 minutes at 100° C. The number of thermal cycles applied before the cumulative failure percentage reached 0.1% was 2100 cycles, which was comparable to or greater than that obtained by a conventional ball-to-electrode connector structure described in the Comparative Example below.

EXAMPLE 2

The plastic substrate used in this example was the same as that used in Example 1. The open end of each through-hole on one side of the substrate was sealed with the same heat-resisting adhesive tape as used in Example 1, and a 0.25 mm thick metal mask having openings with a diameter of 1.0 mm at the same intervals as the through-holes was positioned on the other side of the substrate such that each electrode pad on the surface of the substrate appeared in one of the openings of the metal mask. A solder paste containing a solder powder of a 96.5Sn/3.5Ag alloy (in weight percent) was applied to fill each opening of the metal mask by printing, and, after removal of the metal mask, it was subjected to reflowing at a peak temperature of about 240° C. to give a 0.2 mm high solder bump.

Thereafter, a 0.3 mm thick metal mask having openings with a diameter of 1.0 mm at the same intervals as the through-holes was positioned on the same side of the substrate as the previous mask such that each solder bump formed was received in one of the openings of the metal mask. After a solder paste containing a solder powder of a 63Sn/37Pb alloy (in weight percent) was applied to fill each opening of the metal mask by printing and the metal mask was removed, a solder ball made of a 95Pb/5/Sn alloy (in weight percent) was positioned on the applied solder paste. The solder paste was then subjected to reflowing at a peak temperature of about 210° C. to join the solder ball to the solder bump.

The cross-section in the vicinity of the resulting ball-to-electrode connector structure was inspected visually. The visual inspection showed that a slight amount of the 96.5Sn/3.5Ag solder used to form the solder bump had penetrated into each through-hole and that the amount of the solder entering the through-hole was nearly the same for all the through-holes inspected. The average shear strength of the solder balls joined to the electrodes was 1.70 kgf for 20 through-holes selected at random.

The above process for forming a ball-to-electrode connector structure was applied to a 21 mm$^2$ BGA package having 256 terminals with a 1.27 mm pitch between adjacent terminals. The resulting BGA package was subjected to a thermal cycle test under the same conditions as described in Example 1. The number of thermal cycles applied before the cumulative failure percentage reached 0.1% was 3500 cycles, which was much greater than that obtained by a conventional ball-to-electrode connector structure described in the Comparative Example below.

EXAMPLE 3

The plastic substrate used in this example was the same as that used in Example 1. The open end of each through-hole on one side of the substrate was sealed with the same heat-resisting adhesive tape as used in Example 1, and a flux was applied to each electrode pad on the other side of the substrate. Thereafter, a copper ball with a diameter of 0.75 mm and having a 35 μm thick surface coating layer of a eutectic solder formed by electrolytic plating was positioned on each electrode pad to which the flux had been applied and was heated to a peak temperature of about 210° C. so as to melt the solder of the surface coating, resulting in the formation of a connector structure in the form of balls having a height of about 0.75 mm and joined to the electrode pads by the solder of the surface coating.

The cross-section in the vicinity of the resulting ball-to-electrode connector structure was inspected visually. The visual inspection showed that a slight amount of the solder of the surface coating had penetrated into each through-hole and that the amount of the solder entering the through-hole was nearly the same for all the substrates. The average shear strength of the solder balls joined to the electrodes was 1.50 kgf for 20 samples selected at random.

The above process for forming a ball-to-electrode connector structure was applied to a 21 mm² BGA package having 256 terminals with a 1.27 mm pitch between adjacent terminals. The resulting BGA package was subjected to a thermal cycle test under the same conditions as described in Example 1. The number of thermal cycles applied before the cumulative failure percentage reached 0.1% was 3500 cycles, which was much greater than that obtained by a conventional ball-to-electrode connector structure described in the Comparative Example below.

EXAMPLE 4

The plastic substrate used in this example was the same as that used in Example 1. A UV-curable (negative-working) solder photoresist solution was applied twice alternately to the two surfaces of the substrate and then dried to form a photoresist film having a thickness of about 40 μm on each surface. In this stage, each through-hole was filled with the photoresist solution. A photomask having circular UV light-shielding areas having a diameter of 0.58 mm was positioned on one side of the substrate such that the center of each through-hole was in registration with that of one of the circular light-shielding areas of the photomask, and the photoresist films on both surfaces were exposed to UV light at a does of 500 mJ/cm² to cure the films except for the masked areas on one side. The uncured photoresist film on the masked side of the substrate was then removed by treatment with a developing solution for the photoresist to form openings in which the through-holes and part of the surrounding electrodes pads were revealed.

After a flux was applied to each revealed electrode pad, a solder ball made of a 63/Sn/37Pb alloy (in weight percent) and having a diameter of 0.76 mm was positioned on the electrode pad and heated to a peak temperature of about 210° C. so as to melt the solder ball, resulting in the formation of a 0.66 mm high solder ball joined to the electrode pad.

The cross-section in the vicinity of the resulting ball-to-electrode connector structure was inspected visually. The visual inspection showed that a slight amount of the solder had penetrated into each through-hole and that the amount of the solder entering the through-hole was nearly the same for all the substrates.

The shear strength of the solder ball-to-electrode connector structure and the results of a thermal cycle test of a BGA package to which this connector structure was applied were comparable to or higher than those obtained by a conventional ball-to-electrode connector structure described in the Comparative Example below.

COMPARATIVE EXAMPLE

Figure 13A:
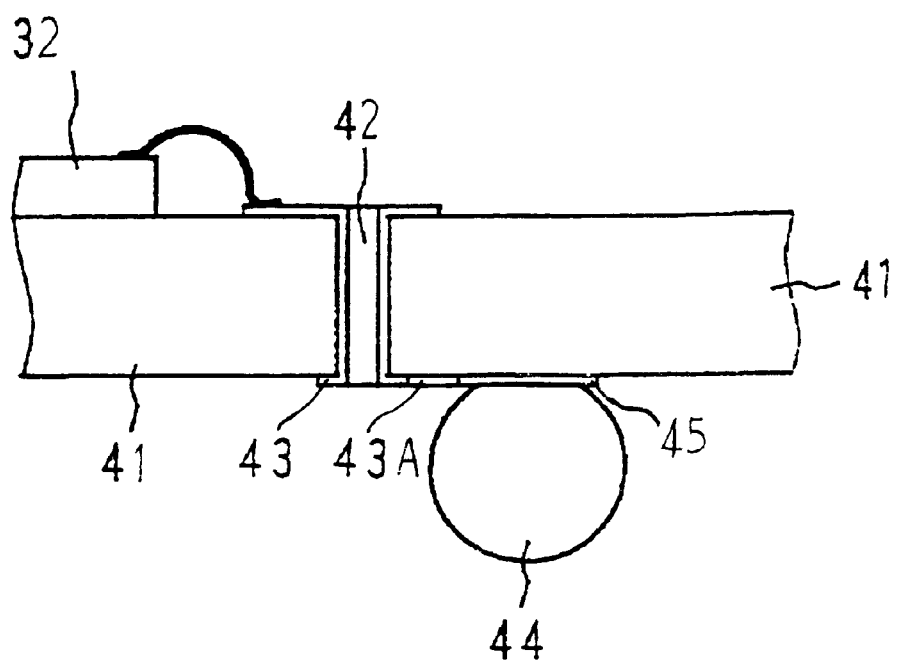
FIGS. 13a and 13b are a cross-sectional view and a plan view, respectively, showing a portion of a BGA package to which a solder ball is joined in a conventional manner.
Figure 13B:
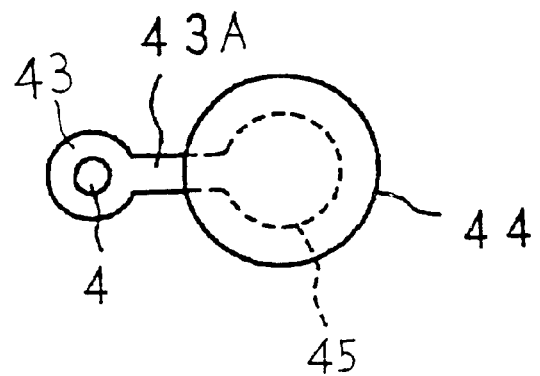

A conventional BGA connector structure of the dog-bone type as shown in FIGS. 13a and 13b was formed as follows.

The plastic substrate used was the same as that used in Example 1 except that each Ni/Au-plated copper electrode pad surrounding a through-hole had a diameter of 0.40 mm on one side of the substrate and it was connected to a second electrode pad with a diameter of 0.80 mm through a short extension as shown in FIGS. 13a and 13b. The center-to-center distance between the two electrode pads was 0.666 mm, and the second electrode pad and the extension connecting the two electrode pads were also made of Ni/Au plated copper. After a flux was applied to each second electrode pad, a solder ball made of a 63Sn/37Pb alloy (in weight percent) and having a diameter of 0.76 mm was positioned on the second electrode pad so as to be apart from the through-hole and was heated to a peak temperature of about 210° C. so as to melt the solder ball, resulting in the formation of a 0.65 mm high solder ball joined to the second electrode pad. The average shear strength of the solder balls joined in this manner was 1.50 kgf for 20 through-holes selected at random.

The above process for forming a ball-to-electrode connector structure was applied to a 21 mm² BGA package having 256 terminals with a 1.27 mm pitch between adjacent terminals. The resulting BGA package was subjected to a thermal cycle test under the same conditions as described in Example 1. The number of thermal cycles applied before the cumulative failure percentage reached 0.1% was 2000 cycles.

As can be understood from the above examples, the BGA connector structure according to the present invention can possess a shear strength and a resistance to thermal cycles both improved over a conventional BGA connector structure. Furthermore, since metallic balls are joined to electrodes of the package at the positions of the through-holes formed in the substrate, thereby making it possible to reduce the ball pitch, the BGA connector structure according to the present invention can cope with an increase in the number of I/O terminals and hence contributes to an increase in packaging density desired for electronic packages. In addition, the reliability of the connector structure can be further improved by joining each metallic ball through a solder or a combination of a metallic bump and a connecting solder. Nevertheless, the processes for forming the BGA connector structure according to the present invention are rather simple compared to conventional precesses, since there is no need to form a second electrode pad in the shape of a dog bone.

It will be appreciated by those skilled in the art that numerous variations and modifications may be made to the invention as described above with respect to specific embodiments without departing from the spirit or scope of the invention as broadly described.

What is claimed is:

1. A method for forming a connector structure of a ball-grid array (BGA) type in an electronic package having at least one hollow through-hole, comprising at least one metallic ball joined to an electrode of the package at the position of the through-hole on at least one surface of the package, comprising joining the metallic ball to the electrode of the package at the position of the through-hole, the metallic ball being a solder ball which is joined to the electrode by reflowing the solder ball while pressure within the through-hole is controlled.

2. The method of claim 1, wherein the metallic ball is a solder ball directly joined to the electrode of the package, the method including the steps of:

sealing an open end of the through-hole on one surface of the package, setting the solder ball on the electrode of the package on the other surface thereof at the position of the through-hole, and subjecting the solder ball to reflowing to join the solder ball to the electrode.

3. The method of claim 1, wherein the metallic ball is a solder ball directly joined to the electrode of the package, the method including the steps of:

increasing pressure within the through-hole slightly above atmospheric pressure, setting the solder ball on the electrode of the package on one surface thereof at the position of the through-hole, and subjecting the solder ball to reflowing while pressure within the through-hole is kept slightly above atmospheric pressure.

4. The method of claim 1, wherein the method includes the steps of:
increasing pressure within the through-hole slightly above atmospheric pressure,
forming a solder-containing layer on the electrode of the package on one surface thereof at the position of the through-hole,
setting the metallic ball on the solder-containing layer, and
subjecting the solder-containing layer to reflowing to join the metallic ball to the electrode through the solder while the pressure within the through-hole is kept slightly above atmospheric pressure.

5. The method of claim 1, wherein the electronic package has a substrate in which said at least one through-hole is formed, and wherein the substrate has an electrically insulating film overlaid on both surfaces thereof except for the area on at least one surface thereof to which the metallic ball is attached, the method including the steps of:
applying a photoresist film to both surfaces of the substrate,
forming an opening in the photoresist film on one surface of the substrate at the position of the through-hole by exposure of a selected area of the photoresist film followed by development,
setting the metallic ball in the opening of the photoresist film so as to sit it on an electrode of the substrate on said one surface thereof, and
subjecting the metallic ball to reflowing to join it to the substrate.

6. A method for forming a connector structure of a ball-grid array (BGA) type in an electronic package having at least one hollow through-hole, comprising at least one metallic ball joined to an electrode of the package at the position of the through-hole on at least one surface of the package, comprising joining the metallic ball to the electrode of the package at the position of the through-hole, the metallic ball being joined to the electrode of the package through solder, the method including melting the solder to join the metallic ball to the electrode through the solder at the position of the through-hole while pressure within the through-hole is controlled.

7. The method of claim 6, wherein the metallic ball has a surface coating of solder and is joined to the electrode of the package through the solder, the method including the steps of:
sealing an open end of the through-hole on one surface of the package,
setting the metallic ball on the electrode of the package on the other surface thereof at the position of the through-hole, and
subjecting the coating of solder to reflowing to join the metallic ball to the electrode through the solder.

8. The method of claim 6, wherein the metallic ball has a surface coating of solder and is joined to the electrode of the package through the solder, the method including the steps of:
increasing pressure within the through-hole slightly above atmospheric pressure,
setting the metallic ball on the electrode of the package on one surface thereof at the position of the through-hole, and
subjecting the coating of solder to reflowing to join the metallic ball to the package through the solder while the pressure within the through hole is kept slightly above atmospheric pressure.

9. The method of claim 6, wherein the method includes the steps of:
sealing an open end of the through-hole on one surface of the package,
forming a solder-containing layer on the electrode of the package on the other surface thereof at the position of the through-hole,
setting the metallic ball on the solder-containing layer, and
subjecting the solder-containing layer to reflowing to join the metallic ball to the electrode through the solder.

10. The method of claim 6, wherein the electronic package has a substrate in which said at least one through-hole is formed, and wherein the substrate has an electrically insulating film overlaid on both surfaces thereof except for the area on at least one surface thereof to which the metallic ball is attached, comprising the steps of:
applying a photoresist film to both surfaces of the substrate,
forming an opening in the photoresist film on one surface of the substrate at the position of the through-hole by exposure of a selected area of the photoresist film followed by development,
setting the metallic ball having a surface coating of solder in the opening of the photoresist film so as to sit it on an electrode of the substrate on said one surface thereof, and
subjecting the solder coating to reflowing to join the metallic ball to the substrate through the solder.

11. The method of claim 6, wherein the electronic package has a substrate in which said at least one through-hole is formed, and wherein the substrate has an electrically insulating film overlaid on both surfaces thereof except for the area on at least one surface thereof to which the metallic ball is attached, the method including the steps of:
applying a photoresist film to both surfaces of the substrate,
forming an opening in the photoresist film on one surface of the substrate at the position of the through-hole by exposure of a selected area of the photoresist film followed by development,
setting the metallic ball in the opening of the photoresist film so as to sit it on an electrode of the substrate on said one surface thereof, and
subjecting the metallic ball to reflowing to join it to the substrate.

12. A method for forming a connector structure of a ball-grid array (BGA) type in an electronic package having at least one hollow through-hole, comprising at least one metallic ball joined to an electrode of the package at the position of the through-hole on at least one surface of the package, comprising joining the metallic ball to the electrode of the package at the position of the through-hole, the metallic ball being joined to the electrode of the package through a metallic bump and solder, the method including melt-forming the metallic bump on the electrode of the package at the position of the through-hole while pressure within the through-hole is controlled.

13. The method of claim 12, wherein the method includes the steps of:
sealing an open end of the through-hole on one surface of the package, melt-forming the metallic bump on the electrode of the package on the other surface thereof at the position of the through-hole, forming a solder-containing layer on the metallic bump, setting the metallic ball on the solder-containing layer, and subjecting the solder-containing layer to reflowing to join the metallic ball to the metallic bump through the solder.

14. The method of claim 12, wherein the method includes the steps of:

increasing pressure within the through-hole slightly above atmospheric pressure, melt-forming the metallic bump on the electrode of the package on one surface thereof at the position of the through-hole while the pressure within the through-hole is kept slightly above atmospheric pressure, forming a solder-containing layer on the metallic bump, setting the metallic ball on the solder-containing layer, and subjecting the solder-containing layer to reflowing to join the metallic ball to the metallic bump through the solder.

* * * * *